(12) United States Patent
Melgaard et al.

(10) Patent No.: US 6,552,560 B2
(45) Date of Patent: Apr. 22, 2003

(54) WAFER-LEVEL BURN-IN OVEN

(75) Inventors: Hans L. Melgaard, North Oaks, MN (US); Jeffrey A. Bell, Minneapolis, MN (US)

(73) Assignee: Despatch Industries, L.L.P., Minneapolis, MN (US)

( * ) Notice: Subject to any disclaimer, the term of this patent is extended or adjusted under 35 U.S.C. 154(b) by 0 days.

(21) Appl. No.: 09/813,074

(22) Filed: Mar. 20, 2001

(65) Prior Publication Data

US 2002/0135389 A1 Sep. 26, 2002

(51) Int. Cl.[7] .............................................. G01R 31/02
(52) U.S. Cl. ...................... 324/760; 324/765; 324/158.1
(58) Field of Search .................................... 324/760, 765, 324/158.1, 73.1; 165/80.01–80.03, 185

(56) References Cited

U.S. PATENT DOCUMENTS

| | | | |
|---|---|---|---|
| 4,531,146 A | | 7/1985 | Cutchaw |
| 4,845,426 A | * | 7/1989 | Nolan et al. ............. 324/158 F |
| 5,168,348 A | | 12/1992 | Chu et al. |
| 5,650,732 A | * | 7/1997 | Sakai ......................... 324/755 |
| 5,966,940 A | | 10/1999 | Gower et al. |
| 6,019,164 A | | 2/2000 | Getchel et al. |
| 6,073,681 A | | 6/2000 | Getchel et al. |
| 6,108,937 A | | 8/2000 | Raaijmakers |
| 6,257,319 B1 | * | 7/2001 | Kainuma et al. .......... 165/11.1 |
| 6,313,653 B1 | * | 11/2001 | Takahashi et al. .......... 324/760 |

* cited by examiner

Primary Examiner—Kamand Cuneo
Assistant Examiner—Jimmy Nguyen
(74) Attorney, Agent, or Firm—Fredrickson & Byron, P.A.

(57) ABSTRACT

A system for burn-in testing of integrated circuits and semiconductors at the wafer level and apparatus and method utilizing the system. The cascading heat control system of the invention has connected first and second heat transfer circuits to regulate the temperature of and the environment around semiconductor wafers under test. A low temperature gas is circulated, as a heat transfer gas, through the cascading heat control system. The heat transfer gas serves as a heat transfer medium and provides a low dew point environment, or both a low dew point and low oxidation environment, within the system. At least one wafer chuck incorporating a heat exchanger, or a series of such wafer chucks, and containing a semiconductors for testing is connected to the cascading heat control system through the heat exchanger. In the apparatus, a burn-in oven, the wafer chuck or series of wafer chucks are contained within a chamber environment. The first heat transfer circuit circulates heat transfer gas to the wafer chuck and a second heat transfer circuit circulate heat transfer gas within and through the chamber environment. In the method of the invention, heat transfer gas is circulated through the circuits and may be heated to a target temperature. Once at the target temperature, test signals are provided to the semiconductor wafers under test and cascading heat control system regulates the temperature and environment within the apparatus.

28 Claims, 3 Drawing Sheets

WAFER-LEVEL BURN-IN OVEN

BACKGROUND OF THE INVENTION

1. Field of the Invention

The invention relates to apparatus and method for burn-in testing of integrated circuits and semiconductors at the wafer level.

2. Description of the Related Art

Semiconductor manufacturers make integrated circuit chips in batch on what is typically referred to as wafers or semiconductor wafers. These wafers are generally flat circular disks, between 100 millimeters to 300 millimeters or greater in diameter and may contain one to upwards of several hundred integrated circuit chips. When manufacture of the wafer is completed, the individual chips or die are cut or "diced" from the wafer and are later mounted into single chip or multiple chip packages for implementation in a printed circuit board or other application for electronic uses.

It is customary practice to test each chip, either individually or as part of a multiple chip package to determine if each chip as manufactured, electrically matches design criteria, matches performance criteria of a system in which the chip is to be implemented, and will be reliable in operation. If a chip fails reliability testing, the chip is not suitable for implementation in a system without repairing the chip or exercising redundancy features which may have been designed into the chip.

The integrated circuit chips are assembled into packages for protection and convenience in handling as well as for further assembly into equipment. These latter processing stages contribute a major portion of the manufacturing cost of the finished products utilizing semiconductor chip. If failure is detected after the chips are packaged, significant costs can be incurred due to failure of electronic systems into which the multiple chip packages are incorporated. Thus, before packaging, integrated circuit chips must be tested thoroughly.

Performance testing of chips is used to speed-sort chips into different categories suitable for different applications and sale at different prices. Reliability testing is used to screen out chips having an undesirably short life span. Typically, a significant percentage of a group of chips will fail early in their lifetime due to marginal conditions during manufacture. Subsequently, a very low percentage of the group will fail during an extended period of use of the chips. Reliability screening of a semiconductor chip is typically performed by a process of supplying test signal patterns to chips under test to repeatedly stimulate all devices and wires on a chip, and is typically performed at elevated temperatures to simulate the first six months of operation. This screening process is commonly referred to as burn-in or burn-in testing.

Burning in chips tends to induce accelerated failures. While very valuable, the process of burn-in has historically been time consuming and expensive for semiconductor manufacturers, particularly if testing is performed on individual chips or after chips are incorporated into a package. Existing burn-in is typically performed on integrated circuits at temperatures between 90° C. to 125° C., for anywhere between 24 to 168 hours. Obviously, this slow rate of reliability testing impedes volume production of functional semiconductors and adds tremendous cost. Generally, manufacturers have attempted to reduce these costs by burn-in testing of semiconductor wafers at the wafer level.

In wafer level burn-in, electrical terminals from a test apparatus or test board are brought into contact with contact pads of the individual chips on a semiconductor wafer to test the chips for electrical performance. The wafer is typically mounted in a wafer chuck, a holder for the wafer, having electrical probes or pins that align with contact pads of the integrated circuit chips on the wafer. Through the use of automatic computerized testing, power sources provide required test voltages and electronic signals for communication between the integrated circuit chips of the wafer and the computerized test equipment. The equipment automatically records the results for all of the integrated circuit chips on the wafer. The number, sequence, and types of test specified have been programmed into the equipment, and the test is carried out generally without operator assistance. The equipment records the characteristics of all integrated circuit chips tested, passes as well as failures, by wafer and production lot. Rejects are marked with a visible ink spot for identification, and some equipment also generates maps of the wafers to record the location of the rejects on the wafer. Depending upon their performance, the integrated circuit chips can be sorted for disposal, if rejected, or for specified uses and applications appropriate to the design and performance criteria they meet.

There are numerous wafer chucks of various configurations that are known for use in wafer level burn-in testing. For example, U.S. Pat. No. 6,910,254 to Wood et al. discloses a wafer chuck consisting of two halves. The first half of the test fixture is a wafer cavity plate for receiving the wafer and the second half establishes electrical communication between the wafer and the electrical test equipment. U.S. Pat. No. 5,929,651 to Leas et al. discloses an apparatus and method for simultaneously testing or burning in integrated circuit chips on a wafer. This apparatus comprises a glass ceramic carrier having test chips and means for connection to paths of a large number of chips on a product wafer. Voltage regulators on the test chips provide an interface between a power supply and power pads on the product chips with at least one voltage regulator for each product chip. The test chips can provide test functions such as test patterns and registers for storing test results.

U.S. Pat. No. 4,531,146 to Cutchaw discloses an apparatus for cooling a high-density integrated circuit package. The apparatus includes a base in which the circuit package or wafer is mounted and a heat exchanger which mounts on the base to enclose the wafer and carry away the heat generated during testing by means of a fluid coolant which is passed through the heat exchanger. The heat exchanger includes a housing having a cooling chamber, one surface of which is formed of a pliable thin wall diaphragm of thermally conductive material. Heat generated by burn-in testing of the integrated circuits is exchanged across the diaphragm of thermally conductive material. A liquid coolant is passed through the chamber of the heat exchanger under pressure but does not come into direct contact with the device under test.

U.S. Pat. No. 6,108,937 to Raaijmakers discloses apparatus and method for cooling semiconductor wafers. In one embodiment a wafer and its supporting structure is lifted after high temperature testing to a position in close proximity to a cold wall of a thermal processing chamber which acts as a heat sink. Conductive heat transfer across a small gap from the wafer to the heat sink facilitates the cooling of the wafer. Other embodiments are disclosed but generally involve the concept of bringing the heated wafer under test into close proximity with a cooling station or plate to accomplish the heat transfer and cooling of the wafer.

U.S. Pat. No. 5,168,348 to Chu et al. discloses a heat transfer mechanism for removing heat generated in electronic circuit modules. Chu et al. utilize an impingement cooled compliant heat sink to extract heat from an array of computer chips in an electric module. Though various embodiments are disclosed, the most basic utilizes a metal sheet brought into contact with chips or a multi-chip module with the metal sheet acting as a spreader plate for jet impingement immersion cooling with fluorocarbon, liquid nitrogen or other dielectric liquids.

Known methods and apparatus for testing of integrated circuits generally rely upon an element in the testing apparatus that acts as a heat sink or heat exchanger to receive heat from the wafer under test after the wafer has been run through a test cycle. Further, known apparatus generally are not utilized to regulate the temperature of the wafer under test or to maintain the wafer at a desired or target test temperature throughout a test cycle.

If burn-in testing is performed in ambient air, an oxygen-containing environment, the metal parts and contacts of the testing system and associated electronics are susceptible to oxidation. Over time, these oxygen-sensitive parts contacts may be oxidized, requiring replacement of the parts or the entire system. For some applications, testing of integrated circuit chips may be conducted at high or low temperatures. When testing is conducted at low temperatures, moisture in an ambient air environment may condense on the sensitive electronics, metal parts, and contacts of testing apparatus. This condensation can lead to shorting and failure of the sensitive parts of the testing apparatus or functional failure of the apparatus as whole. Such shorting or failure would lead to unwanted manufacturing and processing downtime.

It is desirable to provide apparatus and a testing system that will allow for both high and low temperature burn-in testing without the aforementioned disadvantages.

SUMMARY OF THE INVENTION

In one embodiment, the oven has one or more wafer chucks for holding wafers during wafer burn-in testing, a first temperature control circuit for providing a heat transfer gas to the wafer chucks to control the temperature of the wafers held within the chucks, and a second temperature control circuit for providing heat transfer gas to regulate the environment around the wafer chucks and the first temperature control circuit as the wafers are cycled between temperature extremes by the first temperature control circuit. The first temperature control circuit and second temperature control circuit are adapted to receive heat transfer gas from a heat transfer gas source. The oven may include a heat transfer gas source or may be adapted to connect to a heat transfer gas source located at the test facility.

In another embodiment, the invention is directed to an oven for wafer level burn-in testing of electronics/semiconductor wafers. The oven has an oven unit which includes a chamber defining a chamber environment. The oven further includes a cascade heat control system with a first heat transfer circuit for providing a heat transfer gas to a wafer chuck module and a second heat transfer circuit for providing heat transfer gas to the chamber environment. The two circuits are connected by a pressure release conduit by a first venting valve for venting of heat transfer gas from the first heat transfer circuit into the second heat transfer circuit. The second heat transfer circuit also has a second venting valve for venting of heat transfer gas from the second circuit to the outside environment. The oven includes at least one wafer chuck module including a test board and at least one wafer chuck for holding at least one electronic wafer for burn-in testing. The module further includes an inlet conduit and outlet conduit, and is in integral flow-through communication with the first heat transfer circuit connected thereto by the inlet and outlet conduits. The wafer chuck module is disposed within the chamber environment of the oven unit.

In another embodiment, the invention is directed to a method of wafer level burn-in testing. In accordance with a method of the invention, an oven is provided, the oven having an oven unit including a chamber defining a chamber environment, a cascade heat control system having a first heat transfer circuit for providing heat transfer gas to a wafer chuck module, and a second heat transfer circuit for providing heat transfer gas to the chamber environment. The two circuits are connected by a pressure release conduit having a first venting valve for venting of heat transfer gas from the first heat transfer circuit into the second heat transfer circuit and the second heat transfer circuit has a second venting valve for venting of heat transfer gas from the second circuit to the outside environment. The oven has at least one wafer chuck module, including a test board, and at least one wafer chuck for holding at least one electronic or semiconductor wafer for burn-in testing and an inlet conduit and outlet conduit. The module is disposed within the chamber environment, and is in integral part of the first heat transfer circuit being connected thereto by the inlet and outlet conduits. An electronic or semiconductor wafer is placed into at least one wafer chuck. A cooled inert gas is circulated through the first heat transfer circuit to bring the temperature of the wafer from a target wafer test temperature. The cooled inert gas is also circulated through the second heat transfer circuit to bring the temperature of the chamber environment to a target chamber test temperature. The temperature of the wafer is then maintained at the target wafer test temperature for the duration of the test and the temperature of the chamber environment is maintained at the target chamber test temperature for the duration of the test. Required test signals are provided to the wafer for the duration of the test.

In another embodiment, the invention is directed to a method of wafer level burn-in testing. In accordance with a method of the invention, an oven is provided, the oven having an oven unit including a chamber defining a chamber environment, a cascade heat control system having a first heat transfer circuit for providing heat transfer gas to a wafer chuck module, and a second heat transfer circuit for providing heat transfer gas to the chamber environment. The two circuits are connected by a pressure release conduit having a first venting valve for venting of heat transfer gas from the first heat transfer circuit into the second heat transfer circuit and the second heat transfer circuit has a second venting valve for venting of heat transfer gas from the second circuit to the outside environment. The oven has at least one wafer chuck module, including a test board, and at least one wafer chuck for holding at least one electronic or semiconductor wafer for burn-in testing and an inlet conduit and outlet conduit. The module is disposed within the chamber environment and is an integral part of the first heat transfer circuit being connected thereto by the inlet and outlet conduits. An electronic or semiconductor wafer is placed into at least one wafer chuck. A heated inert gas is circulated through the first heat transfer circuit to bring the temperature of the wafer to a target wafer test temperature. The heated inert gas is also circulated through the second heat transfer circuit to bring the temperature of the chamber environment to a target chamber test temperature. The temperature of the wafer is then maintained at the target wafer test temperature for the duration of the test and the temperature of the chamber environment is maintained at the target chamber test temperature for the duration of the test. Required test signals are provided to the wafer for the duration of the test.

In another embodiment, the invention is directed to an apparatus for burn-in testing of semiconductor wafers. The apparatus or wafer chuck of the invention has a housing for holding a semiconductor wafer. The housing has an upper portion and a lower portion that are connected. The upper portion can be moved relative to the lower portion between open and closed positions. The upper portion of the housing is a heat exchanger that contacts the surface of a semiconductor wafer under test when the housing is in the closed position. The heat exchanger has an inlet port and an outlet port through which a heat transfer gas for heating and cooling of a semiconductor wafer under test passes. The inlet and outlet ports are of sufficient size to permit high volume flow of heat transfer gas through the heat exchanger. The lower portion of the apparatus has a base adapted for connection to a test circuit board and a wafer support upon which a semiconductor wafer can be placed for burn-in testing. Through the base, the wafer support is in electrical communication with the test circuit board and is capable of providing electrical connection between the semiconductor wafer and the test circuit board so that test signals can be received and transmitted.

DETAILED DESCRIPTION OF THE INVENTION

Figure 1:
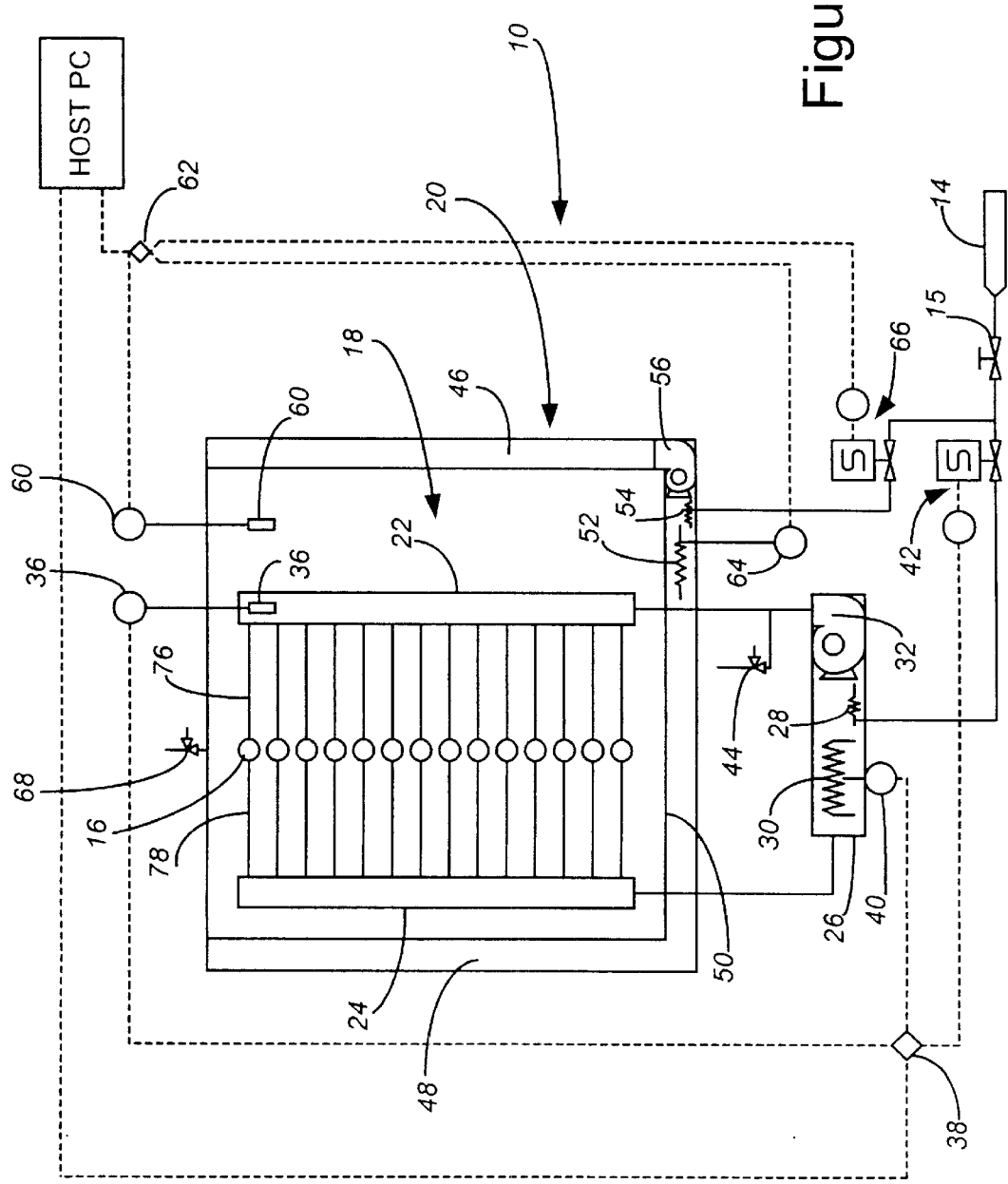
FIG. 1 is a schematic view of a system according to the invention.
Figure 2:
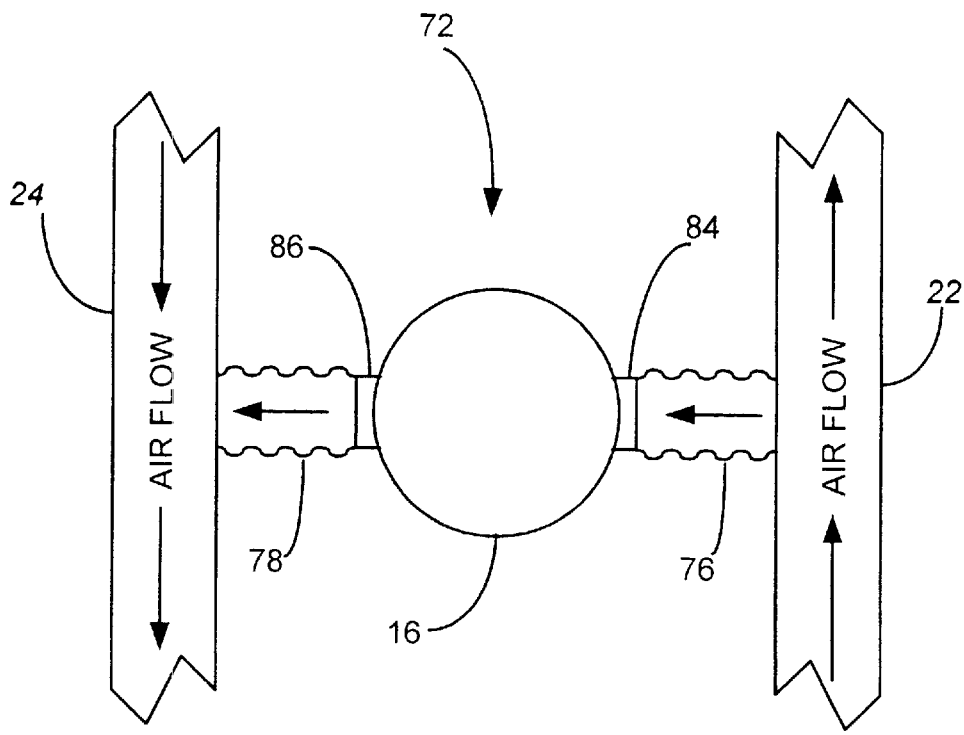
FIG. 2 is a perspective view of a wafer chuck module according to the invention.
Figure 3:
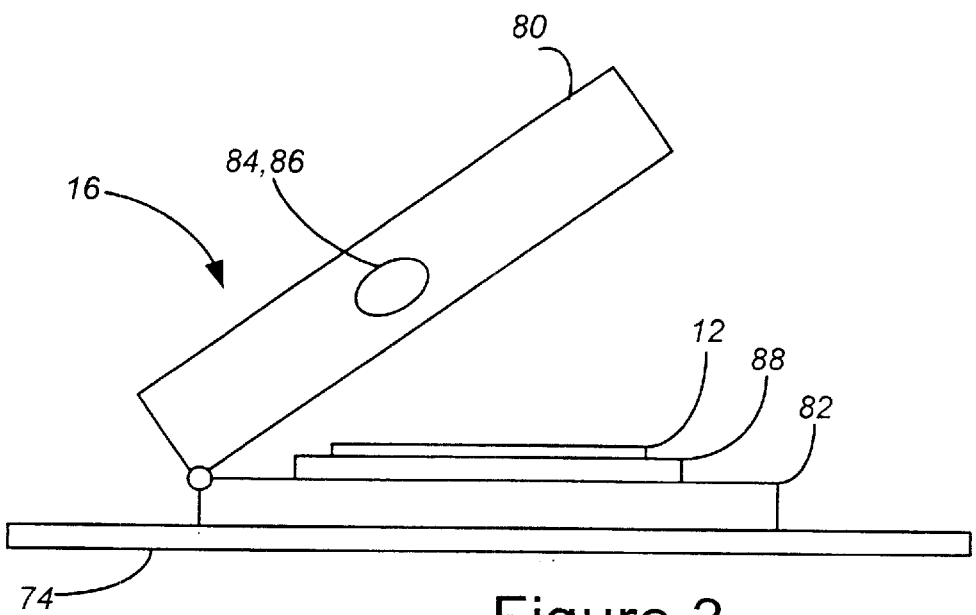
FIG. 3 is a side view of a wafer chuck according to the invention.

The wafer level burn-in system 10 of the invention employs a cascading heat control system to regulate the temperature of semiconductor wafers 12 during burn-in testing. A low temperature heat transfer gas, preferably inert, is circulated through the cascading heat control system and serves as a heat transfer medium. It also serves to flush out undesirable ambient air, containing moisture and oxygen, that may enter the system and oven of the invention during loading and unloading. The heat transfer gas also provides a low dew point or a low dew point and a low oxidation environment within the system.

A low dew point gas is preferable so as to prevent condensation and possible shorting of electron circuits and connections. Any liquified gas exhibiting a phase change or boiling point below lowest temperature at which the system will be operated, generally −40° C., is suitable for use as a low dew point gas. Use of a low dew point, inert gas provides the desired low oxidation environment to prevent oxidation of metallic elements and parts of the system and the sensitive electronic contacts and circuitry employed in burn-in testing. Any known inert gas capable of providing a low oxidation and low dew point environment would be suitable for use as a heat transfer medium. Such gases included but are not limited to argon, nitrogen, helium and the like. Typically, these gases are available in liquid form and can be obtained from vendors. These gases are available in pressurized containers of various sizes. These containers are suitable as sources of heat transfer gas useful in the invention.

Containers of liquid nitrogen, or other suitable gas, may be an integral part of the oven of the invention. More typically, manufacturers of semiconductor wafers 12 would have a source of liquid nitrogen or other suitable gas, on-site at their facility, so the heat transfer gas source 14 need not be in an oven according to the invention. However, the oven would have to be connected to a heat transfer gas source 14 in order to operate. Thus, the invention may include a heat transfer gas source 14 for delivery of heat transfer gas to the cascading heat control system or the system may be adapted for connection to a heat transfer gas source 14.

In one embodiment of the invention, the wafer burn-in system 10 includes one or more wafer chucks 16 for holding wafers 12 during burn-in testing and a first heat transfer circuit, also referred to herein as a first temperature control circuit, 18 and a second heat transfer circuit, also referred to herein as a second temperature control circuit, 20 for providing a heat transfer gas to the wafer burn-in system 10. The first temperature control circuit 18 provides heat transfer gas to the wafer chuck 16 to control the temperature of the wafer 12 held therein. A separate second temperature control circuit 20 provides heat transfer gas to the environment around the first temperature control circuit 18 to regulate the environment around the wafer chucks 16 and the first temperature control circuit 18 as the wafers 12 are cycled between temperature extremes during preparation for, and performance of, burn-in testing. The burn-in system 10 may include or may be adapted for connection to a heat transfer gas source 14. The first temperature control circuit 18 and the second temperature control circuit 20 each have separate connections to the heat transfer gas source 14. The system may also include a manual lockout 15 to manually turn on and shut-off the flow of heat transfer gas from the heat transfer gas source 14.

The first temperature control circuit 18 includes a supply conduit 22 for delivering heat transfer gas to the wafer chucks 16 and a return conduit 24 for receiving heat transfer gas from the chucks 16. These conduits may typically be manifolds. The first temperature control circuit 18 also includes a first recycling conduit 26, located between the first and second conduits 22 and 24, for recycling gas from the second conduit 24 to the first conduit 22. The first recycling conduit 26 operates as a heat exchanger and includes: a first inlet 28 to which the heat transfer gas source 14 is connected and first heater 30 for heating transfer gas that enters into the first recycling conduit 26 for cycling through the first heat transfer circuit 18.

Figure 4:
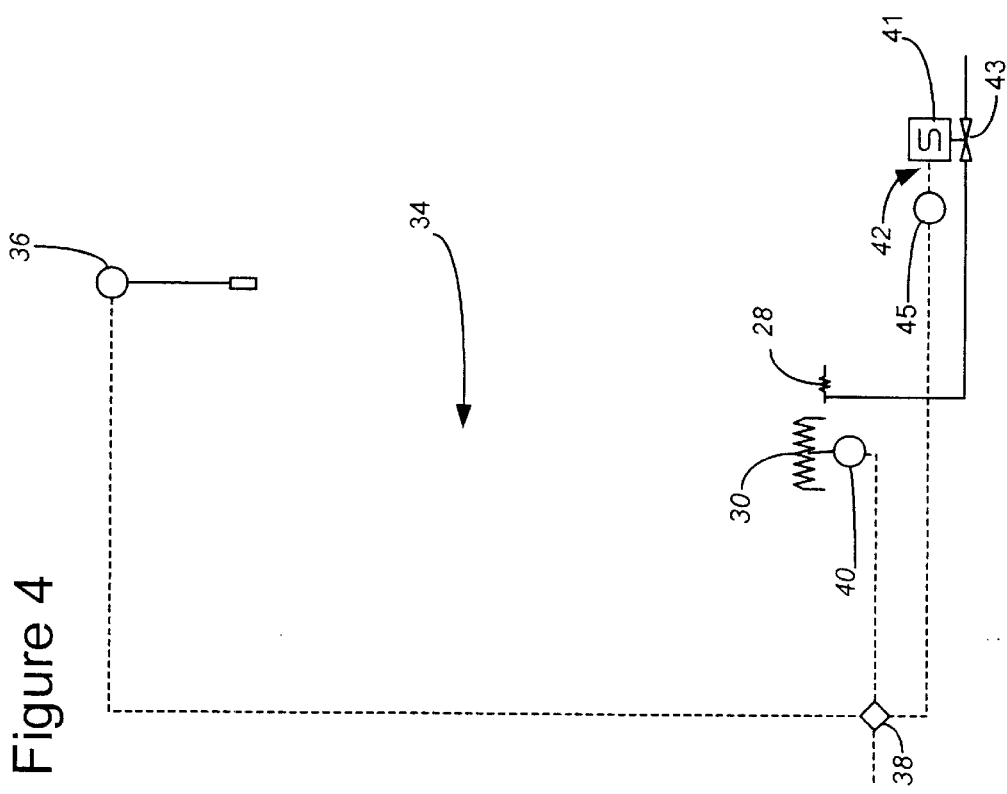
FIG. 4 is a schematic view of a first temperature regulator according to the invention.

Transfer gas is introduced into the first temperature control circuit through the first inlet 28. The recycling conduit 26 also contains a high pressure blower, the first blower 32, for forcing the heat transfer gas through the first temperature control circuit 20. In order to control the temperature of the transfer gas, a first temperature regulator 34 is also provided. The first temperature regulator 34, shown in FIG. 4, includes a first temperature sensing device 36 for sensing the temperature of the transfer gas and a first switch 38 responsive to the sensing device 36 for signaling a first current controller 40 connected to the heater 30 to cycle on and off. The first switch 38 also signals a first control valve 42, also referred to herein as a first solenoid flow valve, which is located between the transfer gas inlet 28 and the transfer gas source 14 to cycle on and off. The first control valve or first solenoid flow valve includes a solenoid 41 a gate or globe 43, and a flow control valve 45.

Pressure can build up with the first temperature control circuit 18 during operation because heat transfer gas is going to be intermittently introduced into the circuit 18 during testing in order to maintain the temperature of the gas circulation at a desired or target temperature. The computing means associated with the electronics of the test board can be programmed to cycle on the first flow control valve 42 whenever the temperature detected by the first temperature sensing device 36 detects a prescribed temperature differential above or below the target temperature. If the temperature is low, the first heater 30 would also be signaled to cycle on. If the temperature is too high, the first heater 30 would not be cycled on. In any event, the system 10 is continuously making these temperature adjustments during burn-in testing which can result in gas pressure build up within the first temperature control circuit 18.

In order to relieve this pressure build up within the first temperature control circuit 18, this circuit also includes a first pressure relief valve 44 for venting the heat transfer gas from the first temperature control circuit 18. Transfer gas vented from the first temperature control circuit 18 through first pressure relief valve 44 is released into the second temperature control circuit 20.

The second temperature control circuit 20 includes a supply plenum 46 for delivering transfer gas into the wafer chuck environment of the wafer burn-in system 10 and a return plenum 48 for receiving heat transfer gas from the wafer chuck environment. The second temperature control circuit 20 includes a second recycling conduit 50, located between the supply plenum 46 and return plenum 48, for recycling gas from the return plenum 48 to the supply plenum 46. The second recycling conduit 50 includes a second heater 52 for heating the heat transfer gas, a second inlet 54 for receiving heat transfer gas from the heat transfer gas source 14, and a second blower 56 for forcing heat transfer gas through the second temperature control circuit.

Figure 5:
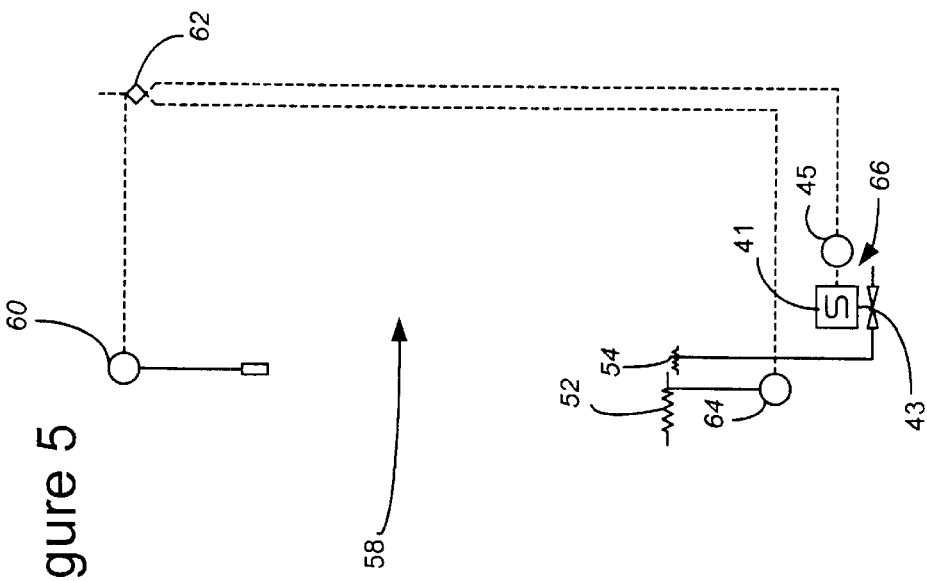
FIG. 5 is a schematic view of a second temperature regulator according to the invention.

As shown in FIG. 5, the second temperature control circuit 20 also includes a second temperature regulator 58 for controlling the temperature of the heat transfer gas in the chuck environment. The second temperature regulator 58 includes a second temperature sensing device 60 for sensing the temperature of the wafer chuck environment. The second temperature regulator 58 also includes a second switch 62 that is responsive to the second temperature sensing device for signaling a second current controller 64 connected to the heater 52 to cycle on and off. The second switch 62 also signals a second control valve 66, also referred to herein as a second solenoid flow valve, which is located between the heat transfer gas source 14 and the heat transfer gas inlet 54 of the second temperature control circuit 20, to cycle on and off. The second control valve or second solenoid flow valve includes a solenoid 41, a gate or globe 43, and a flow control valve 45.

As with the first temperature control circuit 18, pressure can build up within the second temperature control circuit 20 during operation because heat -transfer gas is also being intermittently introduced into the second temperature control circuit 20 during testing. Heat transfer gas is introduced into this temperature control circuit 20 directly from the heat transfer gas source 14 through the second inlet 54 and from the first temperature control circuit 18 through the first pressure relief valve 44. Heat transfer gas is circulated through the second temperature control circuit 20 in order to regulate the environment around the wafer chucks 16 and the first temperature control circuit 18 as the wafers 12 are cycled between temperature extremes by the first temperature circuit 18. This provides the low dew point and low oxidation environment needed to protect the sensitive test circuitry and electronic parts. Further, the temperature of the environment within the system 10 of the invention is maintained at or near the desired or target temperature by the heat transfer gas circulating through the second temperature control circuit 20.

If the temperature within the environment around the first temperature control circuit 18 should deviate from the desired or target temperature, the computing means associated with the electronics of the test circuit board can also be programmed to cycle on the second flow control valve 66 whenever the temperature detected by the second temperature sensing device 60 detects a prescribed temperature differential above or below the target temperature. If the temperature is low, the second heater 52 would also be signaled to cycle on. If the temperature is too high, the second heater 52 would not be cycled on. In any event, these temperature adjustments are continuously made during burn-in testing which can result in gas pressure build up within the second temperature control circuit 20. In order to relieve pressure build up within the second temperature control circuit 20 a second pressure relief valve 68 is also provided and vents heat transfer gas from the chuck environment.

In another embodiment of the invention, the wafer level burn-in system 10 is an oven having an oven unit which includes a chamber defining a chamber environment, a cascade heat control system, and at least one wafer chuck module 72. The cascade heat control system has a first temperature control circuit 18 for providing heat transfer gas to the wafer chuck module 72 and a second temperature control circuit 20 for providing heat transfer gas to the chamber environment. The two circuits, are connected by a pressure release conduit having a first venting valve 44, also referred to as a first pressure relief valve, for venting of heat transfer gas from the first temperature control circuit 18 into the second temperature control circuit 20. The second temperature control circuit 20 has a second venting valve 68, also referred to as a second pressure relief valve, for venting of heat transfer gas from the second circuit 20 to the outside environment.

The oven 10 also includes at least one wafer chuck module 72 including a test circuit board 74 and at least one wafer chuck 16 for holding at least one electronic wafer 12 for burn-in testing. The wafer chuck module 72 has an inlet conduit 76 and an outlet conduit 78 which accommodates the flow of transfer gas through the module 72. The module 72 is in integral flow-through communication with the first temperature control circuit 18 and is connected thereto by the inlet and outlet conduits 76 and 78. The module 72 is disposed within the chamber of the oven and chamber environment.

The wafer chuck 16 of the invention is a housing for holding and processing of a semiconductor wafer 12 under test. The housing has an upper portion 80 or heat exchanger 80 and a lower portion 82 The two portions are connected so that the upper portion 80 can move between open and closed positions relative to the lower portion 82.

When the housing is in the closed position, the heat exchanger 80 contacts the semiconductor wafer 12 under test thereby heating and cooling the semiconductor wafer 12. The heat exchanger 80 has an inlet port 84 and an outlet port 86 which are connected, respectively, to the inlet and outlet conduits 76 and 78 of the wafer chuck module 72. The inlet and outlet ports 84 and 86 and the inlet and outlet conduits 76 and 78 must be of sufficient size to permit the high volume flow of heat transfer gas through the heat exchanger 80. Gas flow rates of 50 cfm or more are typical.

The lower portion 82 of the housing of the wafer chuck 16 has a base adapted for connection to a test circuit board 74 and a wafer support 88 upon which a semiconductor wafer 12 can be placed for burn-in testing. The wafer support 88 can be the upper surface of the lower portion 78. Through the base, the wafer support 88 is in electrical communication with the test circuit board 74 and capable of providing electrical connection between the semiconductor wafer 12 and the test circuit board 74 so that testing signals can be received and transmitted.

Different semiconductor wafers 12 respond differently to test signals. Under the same operating conditions some semiconductor wafers 12 have high heat dissipation and some have low heat dissipation. Due to these differences, the wafer chuck module 72 may include a wafer temperature sensor (not shown in drawings) for sensing the temperature of the wafer 12 and a heating element (not shown in drawings) responsive to a signal from the sensor. The wafer temperature sensor can be located in any suitable location within the wafer chuck 16 that allows the sensor to be in contact with the semiconductor wafer 12 during testing. Heating element, such as a helix or 100 watt resistor, may be located in the gas flow stream in close proximity to the semiconductor wafer 12 either in the inlet conduit 76 of the wafer chuck module 72 or in the inlet port 84 of the wafer chuck heat exchanger 80. The heating element is signaled to cycle on or off by the wafer temperature sensor. This can provide individual temperature control within each wafer chuck 16 thereby maintaining the wafer 12 under test in any of the wafer chucks 16 at the target test temperature. A semiconductor wafer 12 with low heat dissipation is more likely to trigger the heat sensor to signal the heating element to cycle on.

The first temperature control circuit 18 includes a supply conduit 22 for supplying heat transfer gas to the inlet conduit 76 of the wafer chuck module 72. It also includes a return conduit 24 for receiving heat transfer gas from the outlet conduit 78 of the wafer chuck module 72. The first temperature control circuit 18 has a first heat exchange conduit 26 which is located between the supply 22 and return 24 conduits for recycling heat transfer gas from the return conduit 24. The first heat exchange conduit 26 also includes a first heat transfer gas inlet 28 connected to the heat transfer gas source 14 for receiving heat transfer gas into the first circuit 18. It further includes a first heater 30 for heating the heat transfer gas and a first blower 32 for forcing heat transfer gas through the first circuit 18. The first heater 30 is connected to and includes a first current controller 40 that can cycle between on and off positions.

In order to regulate the temperature of the heat transfer gas circulating in the first temperature control circuit 18, a first temperature regulator 34 is provided. The first temperature regulator 34 is capable of cycling the transfer gas between a temperature range of −40° C. to 150° C. The first temperature regulator 34 includes a first temperature sensor 36 for sensing heat transfer gas temperature. Located between the heat transfer gas source 14 and the first transfer gas inlet 28 is a first solenoid flow valve 42. The first solenoid flow valve 42; the first heater 30, and a first switch 38 are also part of the first temperature regulator 34. The first temperature sensor 36, through the first switch 38, is capable of signaling the first solenoid flow valve 42 and the first heater 30 to cycle between on and off configurations. By doing so in response to the heat transfer gas temperature, the first temperature regulator 34 heats and cools the heat transfer gas circulating in the first temperature control circuit 18.

The second heat transfer circuit 20 includes a supply plenum 46 for supplying heat transfer gas to the chamber environment of the oven and a return plenum 48 for receiving heat transfer gas from the chamber environment. The second heat transfer circuit 20 includes a second heat exchange conduit 50 located between the supply 46 and return 48 plenums for recycling heat transfer gas from the return plenum 48. The second heat exchange conduit 50 includes a second heat transfer gas inlet 54 connected to the heat transfer gas source 14 for receiving heat transfer gas into the second heat transfer circuit 20. The second heat exchange conduit 50 also includes a second heater 52 for heating the heat transfer gas and a second blower 56 for forcing heat transfer gas through the second heat transfer circuit 20. The second heater 52 is connected to and includes a second current controller 64 that can cycle between on and off positions.

A second temperature regulator 58 is provided for regulating the temperature of the heat transfer gas circulating in the second heat transfer circuit 20. The second temperature regulator 58 is capable of cycling the heat transfer gas between a temperature range of 0° C. to 80° C. The second temperature regulator 58 includes a second temperature sensor 60 for sensing heat transfer gas temperature, a second solenoid flow valve 66, a the second switch 62, and the second heater 52. The second solenoid flow valve 66 is located between the heat transfer gas source 14 and the second transfer gas inlet 54. The second temperature sensor 60, through the second switch 62, is capable of signaling the second solenoid flow valve 66 and the second heater 52 to cycle between on and off configurations, heating and cooling the heat transfer gas circulating in the second heat transfer circuit 20.

Due to the range of temperatures through which the system and oven of the invention is cycled, materials useful in this invention must be capable of sustained operation over a temperature difference of 40° C. to 150° C. Such materials might include but are not limited to aluminum, specialized rubbers and stainless steel. Further examples include, but are not limited to, silica-based materials and materials such as Viton™ can be utilized.

Elements of the invention such as the heaters (30 and 52), blowers (32 and 56), pressure relief valves (42 and 66), sensors (36 and 60), switches (38 and 62), and the like are standard items known to those in the art. Computing means, including test circuit boards and electronics, useful for burn-in testing similarly are known to those in the art.

The invention is also directed to methods of wafer level burn-in testing utilizing the oven of the invention. The method of the invention for cold cycle testing involves providing an oven unit 10 which includes a chamber defining a chamber environment and a cascade heat control system and at least one wafer chuck module 72. A semiconductor or electronic wafer 12 is placed within the wafer chuck 16. Heat transfer gas is circulated through the first circuit 18 to bring the temperature of the wafer 12 to a target wafer test temperature. Heat transfer gas is also circulated through the second temperature control circuit 20 to bring the temperature of the chamber environment to the target test temperature. For hot cycle testing, the heat transfer gas would be heated. Once the wafer and chamber environment are at the target test temperature, the temperature is maintained for the duration of the test. The required test signals are provided to the wafer for the duration of the test.

The method of the invention for hot or cold cycle testing involves providing an oven 10 having an oven unit 11 which includes a chamber defining a chamber environment and a cascade heat control system 13 and at least one wafer chuck module 30. A semiconductor or electronic wafer is placed within the wafer chuck. Heated inert gas is circulated through the first heat transfer circuit 18 to bring the temperature of the wafer 12 to a target wafer test temperature. Heated inert gas is also circulated through the second heat transfer circuit 20 to bring the temperature of the chamber environment to the target test temperature. Once the wafer and chamber environment are at the target test temperature, the temperature is maintained for the duration of the test. The required test signals are provided to the wafer for the duration of the test.

While exemplary embodiments of the invention and methods of practicing the same have been illustrated and described, it should be understood that various adaptations and modifications may be made therein without departing from the spirit of the invention and the scope of the appended claims.

What is claimed:

1. A wafer burn-in system comprising:
   (a) one or more wafer chucks for holding wafers during wafer burn-in testing;
   (b) a first temperature control circuit for providing a heat transfer gas to said wafer chucks to control the temperature of wafers held within the chucks, the first temperature control circuit being in flow-through communication with the one or more wafer chucks; and
   (c) a separate second temperature control circuit for providing a heat transfer gas to the environment around said first temperature control circuit to regulate the environment around the wafer chucks and the first temperature control circuit as the wafers are cycled between temperature extremes by the first temperature control circuit.

2. The wafer burn-in system of claim 1 further comprising a heat transfer gas source having separate connections to the first temperature control circuit and to the second temperature control circuit.

3. The wafer burn-in system of claim 2 wherein the first temperature control circuit includes a first conduit for delivering said heat transfer gas to said wafer chucks and a second conduit for receiving said gas from the chucks.

4. The wafer burn-in system of claim 3 wherein the first temperature control circuit includes between said first and second conduits a first recycling conduit for recycling gas from the second to the first conduit, said recycling conduit including a first heater for heating said gas and an inlet to which the heat transfer gas source is connected and through which the heat transfer of gas is introduced to the first temperature control circuit and a first blower for forcing the heat transfer gas through the first temperature control circuit.

5. The wafer burn-in system of claim 4 further comprising a first temperature regulator for controlling the temperature of a transfer gas in said first recycling conduit, the first temperature regulator including a temperature sensing device for sensing the temperature of the transfer gas and a switch responsive thereto for signaling a first current controller connected to the first heater to cycle on and off and for signaling a flow control valve located between the transfer gas inlet and the transfer gas source to cycle on and off.

6. The wafer burn-in system of claim 5 wherein the first temperature control circuit includes the first pressure relief valve for venting of heat transfer gas from the first temperature control circuit into the second temperature control circuit.

7. The wafer burn-in system of claim 6 wherein the second temperature control circuit includes a supply plenum for delivering heat transfer gas into the wafer chuck environment and a return plenum for receiving heat transfer gas from the wafer chuck environment.

8. The wafer burn-in system of claim 7 wherein the second temperature control circuit includes between said supply plenum and return plenum a second recycling conduit for recycling gas from the return plenum to the supply plenum, said second recycling conduit including a second heater for heating said heat transfer gas, an inlet for receiving heat transfer gas from the heat transfer gas source, and a blower for forcing heat transfer gas through the second temperature control circuit.

9. The wafer burn-in system of claim 8 further comprising a second temperature regulator for controlling the temperature of the heat transfer gas in the chuck environment, the second temperature regulator including a temperature sensing device for sensing the temperature of the wafer chuck environment and a switch responsive thereto for signaling a second current controller connected to the second heater to cycle on and off and to signal a flow valve located between the heat transfer gas source and the transfer gas inlet of the second temperature control circuit to cycle on and off.

10. The wafer burn-in system of claim 9 wherein the second temperature control circuit includes a pressure relief valve for venting heat transfer gas from the chuck environment.

11. An oven for wafer level burn-in testing of electronic wafers comprising;
    (a) an oven unit including a chamber defining a chamber environment;
    (b) a cascade heat control system comprised of a first heat transfer circuit for providing a heat transfer gas to a wafer chuck module and a second heat transfer circuit for providing a heat transfer gas to the chamber environment, the two circuits being connected by a pressure release conduit having a first venting valve for venting of heat transfer gas from the first heat transfer circuit into the second heat transfer circuit, and the second heat transfer circuit having a second venting valve for venting of heat transfer gas from said second circuit to the outside environment; and
    (c) at least one wafer chuck module including a test board and at least one wafer chuck for holding at least one electronic wafer for burn-in testing, and an inlet conduit and outlet conduit, the module being disposed within the chamber environment, and the module being in integral flow-through communication with the first heat transfer circuit and connected thereto by the inlet and outlet conduits.

12. The oven of claim 11 further comprising a heat transfer gas source for delivery of heat transfer gas to the first and second circuit, the heat transfer gas source being separately connected to each circuit.

13. The oven of claim 12 wherein the first circuit includes a supply conduit for supplying heat transfer gas to the inlet conduit of the wafer chuck module and a return conduit for receiving heat transfer gas from the outlet conduit of the wafer chuck module.

14. The oven of claim 13 wherein the first heat transfer circuit includes a first heat exchange conduit located between the supply and return conduits for recycling heat transfer gas from the return conduit.

15. The oven of claim 14 wherein the first heat exchange conduit includes a first heat transfer gas inlet connected to the heat transfer gas source for receiving heat transfer gas into the first circuit, a first heater for heating the heat transfer gas, and a first blower for forcing heat transfer gas through the first circuit.

16. The oven of claim 15 further comprises a first temperature regulator for regulating the temperature of the heat transfer gas circulating in the first circuit, the regulator including a first temperature sensor for sensing heat transfer gas temperature, a first solenoid flow valve located between the heat transfer gas source and the first transfer gas inlet, a first switch, and the first heater; the first temperature sensor, through the first switch, being capable of signaling the first solenoid flow valve and the first heater to cycle between on and off configurations thereby heating and cooling the heat transfer gas circulating in the first heat transfer circuit.

17. The oven of claim 16 wherein the second heat transfer gas circuit includes a supply plenum for supplying heat transfer gas to the chamber environment and a return plenum for receiving heat transfer gas from the chamber environment.

18. The oven of claim 17 wherein the second heat transfer circuit includes a second heat exchange conduit located between the supply and return plenums for recycling heat transfer gas from the return plenum.

19. The oven of claim 18 wherein the second heat exchange conduit includes a second heat transfer gas inlet connected to the heat transfer gas source for receiving heat transfer gas into the second heat transfer gas circuit, a second heater for heating the heat transfer gas, and a second blower for forcing heat transfer gas through the second heat transfer gas circuit.

20. The oven of claim 19 further comprising a second temperature regulator for regulating the temperature of the heat transfer gas circulating in the second heat transfer gas circuit, the regulator including a second temperature sensor for sensing heat transfer gas temperature, a second solenoid flow valve located between the heat transfer gas source and the second transfer gas inlet, a second switch and the second heater; the second temperature sensor, through the second switch, being capable of signaling the second solenoid flow valve and the second heater to cycle between on and off configurations thereby heating and cooling the heat transfer gas circulating in the second heat transfer circuit.

21. The oven of claim 20 wherein the first temperature regulator is capable of cycling the heat transfer gas between a temperature range of about −40° C. to 150° C. and the second temperature regulator is capable of cycling the heat transfer gas between a temperature range of about 0° C. to 80° C.

22. The oven of any one of claims 11–21 wherein the heat transfer gas is a low dew point gas and is in a liquified state in the heat transfer gas source.

23. The oven of any one of claims 11–21 wherein the heat transfer gas is a low dew point, inert gas and is in a liquified state in the heat transfer gas source.

24. The oven of claim 23 wherein the heat transfer gas is selected from helium, argon, nitrogen.

25. The oven of any one of claims 11–21 wherein the wafer chuck includes a heating element and a wafer temperature sensor for sensing the temperature of the wafer and signaling the heating element to cycle on or off.

26. A method of wafer level burn-in testing comprising:
(a) providing an oven having:
 (i) an oven unit including a chamber defining a chamber environment;
 (ii) a cascade heat control system comprised of a first temperature control circuit for providing heat transfer gas to a wafer chuck module and a second temperature control circuit for providing heat transfer gas to the chamber environment, the two circuits being connected by a pressure release conduit having a first venting valve for venting of heat transfer gas from the first temperature control circuit into the second temperature control circuit, and the second temperature control circuit having a second venting valve for venting of heat transfer gas from said second circuit to the outside environment; and
 (iii) at least one wafer chuck module including a test board and at least one wafer chuck for holding at least on electronic wafer for burn-in testing, and an inlet conduit and outlet conduit, the module being disposed within the chamber environment, and the module being an integral part of the first temperature control circuit and connected thereto by the inlet and outlet conduits;
(b) placing a electronic wafer into the wafer chuck;
(c) circulating cooled inert gas through the first temperature control circuit to bring the temperature of the wafer to a target wafer test temperature;
(d) circulating cooled inert gas through the second temperature control circuit to bring the temperature of the chamber environment to a target chamber test temperature;
(e) maintaining the temperature of the wafer at the target wafer test temperature for the duration of the test and the temperature of the chamber environment at the target chamber test temperature for the duration of the test; and
(f) providing the required test signals to the wafer for the duration of the test.

27. A method of wafer level burn-in testing comprising:
(a) providing an oven having:
 (i) an oven unit including a chamber defining a chamber environment;
 (ii) a cascade heat control system comprising a first temperature control circuit for providing heat transfer gas to a wafer chuck module and a second temperature control circuit for providing heat transfer gas to the chamber environment, the two circuits being connected by a pressure release conduit having a first venting valve for venting of heat transfer gas from the first temperature control circuit into the second temperature control circuit, and the second temperature control circuit having a second venting valve for venting of heat transfer gas from said second circuit to the outside environment; and
 (iii) at least one wafer chuck module including a test board and at least one wafer chuck for holding at least on electronic wafer for burn-in testing, and an inlet conduit and outlet conduit, the module being disposed within the chamber environment, and the module being an integral part of the first temperature control circuit and connected thereto by the inlet and outlet conduits;
(b) placing a electronic wafer into the wafer chuck;
(c) circulating heated inert gas through the first temperature control circuit to increase the temperature of the wafer to a target wafer test temperature;

(d) circulating heated inert gas through the second temperature control circuit to increase the temperature of the chamber environment to a target chamber test temperature;

(e) maintaining the wafer of the wafer test target temperature for the duration of the test and the temperature of the chamber environment at the target chamber test temperature for the duration of the test; and (f) providing the required test signals to the wafer for the duration of the test.

28. An apparatus for burn-in testing of a semiconductor wafer comprising:

(a) a housing for holding a semiconductor wafer, the housing having an upper portion and a lower portion which are connected so as to enable the upper portion to be moved relative to the lower portion between open and closed positions;

(b) the upper portion of the housing having a heat exchanger that contacts the surface of a semiconductor wafer under test when the housing is in the closed position;

(c) the heat exchanger having an inlet port and an outlet port through which a heat transfer gas for heating and cooling of a semiconductor wafer under test passes, the inlet and outlet ports being of sufficient size to permit the high volume flow of heat transfer gas through the heat exchanger;

(d) the lower portion having a base adapted for connection to a test circuit board and a wafer support upon which a semiconductor wafer can be placed for burn-in testing, the wafer support, through the base, being in electrical communication with the test circuit board and capable of providing electrical connection between the semiconductor wafer and the test circuit board so that test signals can be received and transmitted.

* * * * *